United States Patent [19]

Apfelbeck

[11] 4,319,145

[45] Mar. 9, 1982

[54] CONTROL INTERFACE CIRCUIT

[75] Inventor: Otto L. Apfelbeck, Fort Shawnee, Ohio

[73] Assignee: Westinghouse Electric Corp., Pittsburgh, Pa.

[21] Appl. No.: 110,885

[22] Filed: Jan. 10, 1980

[51] Int. Cl.³ .................................. H03K 5/08
[52] U.S. Cl. .................... 307/311; 307/254; 307/540
[58] Field of Search ........... 307/86, 311, 475, 540; 340/163, 650, 782

[56] References Cited

U.S. PATENT DOCUMENTS

| | | | |
|---|---|---|---|
| 3,842,249 | 10/1974 | Geyer et al. | 340/163 |
| 4,086,503 | 4/1978 | Fox et al. | 307/311 |
| 4,114,054 | 9/1978 | Seo et al. | 307/311 |
| 4,121,122 | 10/1978 | Pokandt | 307/311 |
| 4,181,863 | 1/1980 | Parker | 307/311 |

OTHER PUBLICATIONS

"Power Controller Breadboard and Development Requirements" (Final Report) No. 2-57110/4R-3195, Mar. 75, by Perkins et al. pp. cover-x, 22, 24 & 28.

Aerospace Technology Development of Solid State Remote Power Controllers for 300 VDC with current ratings of one & two amps, by Billings No. NASA CR-135199, Jun. 1977, pp. cover-XII and 3-19-3-25.

*Primary Examiner*—Stanley D. Miller, Jr.
*Assistant Examiner*—B. P. Davis
*Attorney, Agent, or Firm*—G. H. Telfer

[57] ABSTRACT

In a control interface circuit for selectively applying a signal to initiate a function in a control device, such as solid state power controller, there is an optical coupler whose primary side is connected in series with a plurality of impedance elements. The transistor switch elements are associated with the various impedances to selectively modify the amount of impedance in the active circuit between the control input terminals. The transistor switch elements are optically controlled by optical coupler devices receptive of inputs from the control device and are maintained with a means for supplying operating voltage that limits the voltage to a value that can be charged in less than the sampling pulse time.

5 Claims, 5 Drawing Figures

CONTROL INTERFACE CIRCUIT

BACKGROUND AND SUMMARY OF THE INVENTION

This invention relates to interface circuits for operation between a controlling device and a controlled device with optical couplers for selective application of function initiating signals to the controlled device and for status indicating signals from the controlled device to the controlling device. The invention has particular utility in solid state power controller apparatus.

Solid state power controllers of generally known configuration are used for controlling conduction in a load circuit between a power source and a load in response to low level control signals from a location that is perhaps remote from the load circuit. For example, in aircraft power systems, power controllers near their associated loads may be controlled from the aircraft cockpit by a controlling device such as a computer controlled multiplex system. Among the required functional capabilities of such apparatus is that there be electrical isolation between the controlling device and the controlled device both for the signals that initiate functions in the controlled device and for the signals indicating the status of the controlled device that are generated in it and supplied back to the controlling device. For these purposes a control interface circuit is used.

It has been a practice to use optical couplers as the isolation devices in control interface circuits. An optical coupler device comprises a light emitting element such as a light emitting diode emissive of either visible or invisible light, that is radiatively coupled with a light sensitive element such as a photodiode or a phototransistor. The multiplicity of required functions can be provided by having in the interface circuit one such optical coupler for applying the function initiating signals to the controlled device and one or more other optical couplers for translation back to the controlling device of status indicating signals. The optical couplers are associated with impedances in series relation with the primary optical coupler so that the conduction of the additional optical coupler devices modifies the amount of impedance in the circuit between the control terminals and thus can vary the voltage at the control terminals.

Speed requirements play a significant role in the design of a suitably effective interface circuit. The light sensitive element at the input of the controlled device is normally associated with a time delay circuit so that the controlled device only responds by changing its conductive state upon application of a control input signal of a given duration. This is useful in that it permits an arrangement in which the controlled device only responds to a steady input signal while the status indicating signals from the controlled device, such as that indicating a fault condition in the load circuit, fed back to the controlling device, may result in the application of only brief sampling pulses insufficient to turn on the controlled device. In general, the control interface circuit must promptly and accurately indicate the value of effective resistance between its terminals because the controlling device measures the resulting voltage and thereby ascertains the status of the remote device. It has been found that currently available designs for such control interface exhibit response times that are undesirably slow and do not provide adequate operation in use with control signals of short sampling time such as about 50 microseconds. Brief sampling pulses are desirable because the computer controlled multiplex system is usually associated with numerous power controllers by time sharing. General background information of the use of multiplex systems for controlling power controllers may be found in Geyer, et al. U.S. Pat. No. 3,842,249, Oct. 15, 1974. Prior control interface circuits employing optical couplers are described in Perkins, et al., "Power Controller Breadboard and Development Requirements", Report 2-57110/4R-3195 for the Department of the Navy, March 1975, and Billings, "Aerospace Technology Development of Solid Stage Remote Power Controllers...", Report No. NASA CR-135199 for the National Aeronautics and Space Administration, June 1977.

It has been discovered that response times of control interface circuits may be greatly improved in accordance with the present invention. The improvement resides in the recognition that the primary cause of slow response is the parasitic capacitance of the optical isolator device. This capacitance causes a built-in time delay to occur so that when a sampling pulse is applied, current flows through this parasitic capacitance into the associated transistor switch causing it to partially turn on and until this capacitance is essentially fully charged, the circuit does not indicate the appropriate resistance at its control terminals. It has been found with the commercially available components over a desired temperature range such as about $-55°$ C. to $125°$ C. that the response time can range up to several times a desirable sampling period of about 50 microseconds.

The invention provides an appropriate arrangement of an optical coupler associated with a series string of impedance elements in the control interface circuit with those impedance elements selectively switched in or out of the effective circuit between the control terminals by transistor switches controlled by optical coupler elements that are arranged in association with the control input terminals so that their operating voltage is supplied from the control input terminals but is associated with means for limiting the operating voltage to a magnitude that results in a full charge on the parasitic capacitance of the optical couplers within a time that is short in relation to the sampling pulse time of the controlling device.

It has been found that circuits can be arranged to perform within a period of approximately 2 to 15 microseconds which adequately permits the operation of the system with sampling pulses of about 50 microseconds.

DESCRIPTION OF THE PREFERRED EMBODIMENTS

Figure 1:
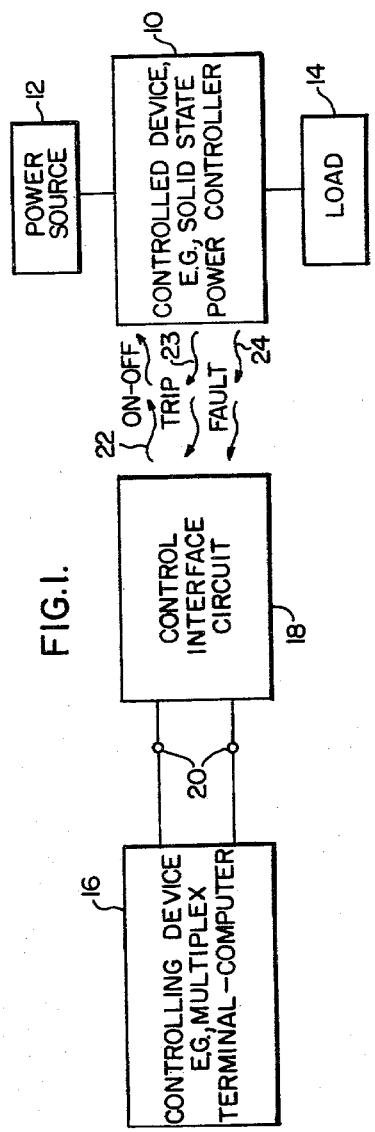
FIG. 1 is a schematic block diagram illustrating the type of apparatus in which the invention is usefully employed.

For further understanding of the context of the present invention reference is made to FIG. 1 which shows a controlled device 10, such as a solid state power controller (which may be either solid state or electromechanical; AC or DC) for the control of power between a power source 12 and a load 14, that is associated with a controlling device 16 such as a computer controlled multiplex system multiplex terminal-computer. Between the controlling device 16 and the controlled device 10 is a control interface circuit 18 comprising control input terminals 20 connected to the controlling device. The control interface circuit 18 is cooperatively associated with the controlled device 10 through optical signal paths 22, 23 and 24.

A primary path 22 between the control interface circuit 18 and the controlled device 10 supplies signals to the controlled device for initiating and maintaining on and off conditions of the controlled device. In addition, optical paths 23 and 24 from the controlled device 10 to the control interface circuit 18 are arranged to supply status indicating signals from the controlled device 10. In the case of a solid state power controller, these may include signals on paths 23 and 24, respectively, when the controller is in a tripped condition and when there is a fault on the load circuit. The control interface circuit 18 is such that its impedance is varied in accordance with the application of trip or fault signals to modify the voltage appearing at the control input terminals 20, thus permitting the controlling device 16 to change the on-off signals in accordance with the status indicating signals. For example, it would normally be required that the power controller not be permitted to turn on or be kept on upon the occurrence of a fault signal. Thus upon the occurrence of such a fault signal and change of the impedance of the control interface circuit to modify the voltage at the control input terminals, this will cause the multiplex unit to change the state of the on/off control path to the off condition and maintain it, at least for a predetermined period of time after which an on-signal may be applied for determining if the fault condition still exists.

Figure 2C:
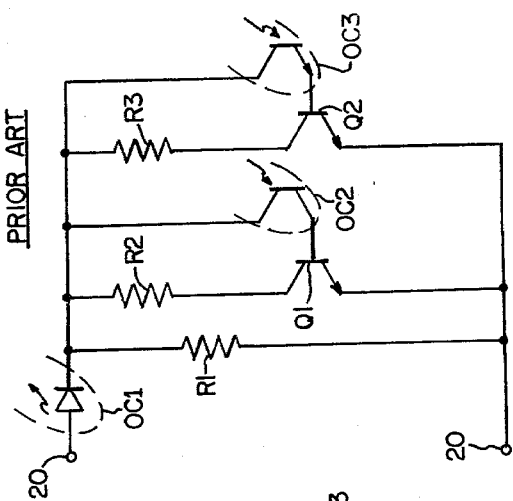
FIGS. 2A, 2B, and 2C are schematic circuit diagrams of control interface circuits in accordance with the prior art.
Figure 2B:
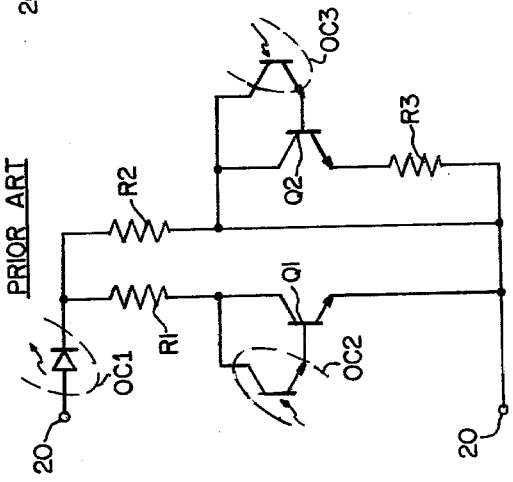
Figure 2A:
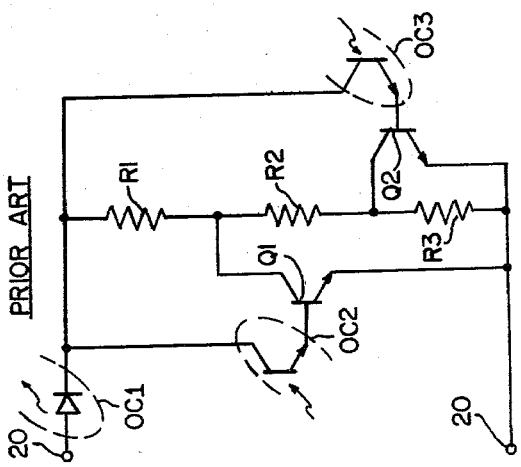

FIGS. 2A, 2B, and 2C illustrate types of control interface circuits as have been heretofore used or proposed. In each instance an optical coupler device OC1 whose light emitting element is in the control interface circuit is connected in series with a plurality of resistive impedances R1, R2 and R3 in one or more circuit paths across the control input terminals 20. These impedances are associated with transistor switches Q1 and Q2 for selectively removing one or more resistors from the conductive path and these switches are associated with the light sensitive elements of optical coupler devices OC1 and OC2 which get their radiation inputs from light emitting elements of the controlled device.

While the specific arrangements are varied, the basic principle of operation is common to the three prior art circuits. For example, in FIG. 2A, various ones of the impedance elements R1, R2 and R3 are in the effective circuit with the light emitting element of OC1 depending on the conductive states of transistors Q1 and Q2. If Q1 and Q2 are both off, voltage at the control input terminals 20 is determined by all three of the resistors R1, R2, and R3. If Q1 is on and Q2 is off, resistor R1 is the only one substantially effecting the voltage at the control input terminals. If Q1 is off and Q2 is on, the conductive path includes resistors R1 and R2 and, if Q1 and Q2 are both on, the conductive path would include resistor R1. It can be seen that the other circuits 2B and 2C operate in similar fashion and also that the number of impedance elements and their values and the number of associated transistor switches may be varied to provide any number of control impedance levels at the input terminals 20 as is desired.

It is desirable to have the ability to derive from the controlling device 16 either a steady constant current or an interrupted current of sampling pulses. The use of sampling pulses encounters the problem of the inherent parasitic capacitance of the phototransistor or other junction device serving as the light sensitive element of the optical couplers OC2 and OC3. These capacitances require full charge in order to maintain a steady state in the condition of the switching transistor Q1 or Q2 with which they are associated. If this charging time takes longer than the sampling pulse then there is not adequate response and therefore the sampling pulse must be elongated or the desired operation will not be achieved.

Figure 3:
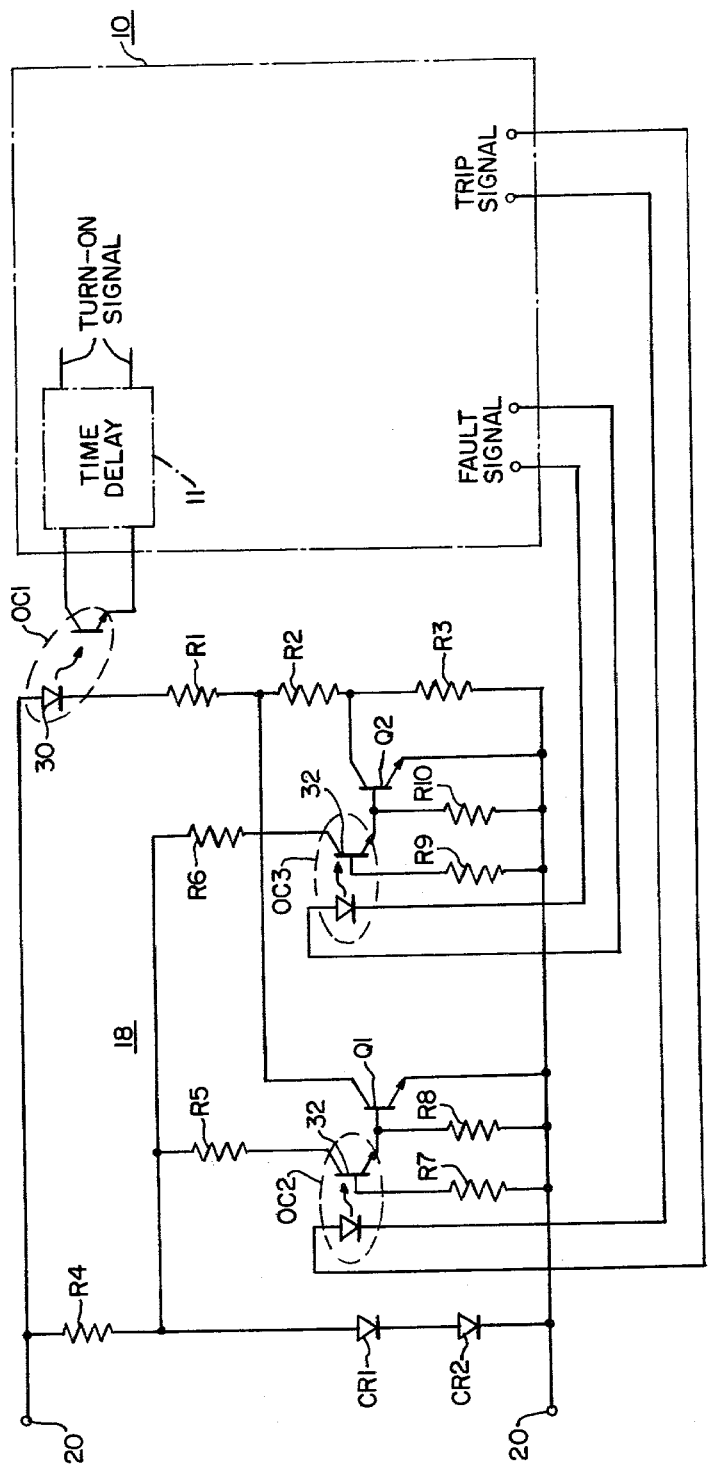
FIG. 3 is a schematic circuit diagram of an embodiment of the present invention.

An exemplary embodiment of the present invention is illustrated in FIG. 3 which shows a control interface circuit that provides response times of from about 2 to 15 microseconds at temperatures from $-55°$ to $+125°$ C. for commercially available components in which the opto-coupler devices are type 4N22.

The illustrated circuit represents three impedance levels, however, it will be understood that circuits with more or fewer impedance levels could be constructed similarly. Impedance elements R1, R2, and R3 are connected in a series string with the light emitting element 30 of optical coupler OC1 between control terminals 20. Transistor switch Q1 is connected across resistors R2 and R3 while transistor switch Q2 is connected across resistor R3 so that here the impedance that the control input terminal sees that results in development of voltage $V_{AB}$ is highest if both Q1 and Q2 are off, is next highest if Q1 is off and Q2 is on and is lowest if Q1 is on regardless of the state of Q2.

The optical couplers OC2 and OC3 get their signals respectively from trip signal and fault signal terminals of the power controller 10. The operating voltage for the optical couplers OC2 and OC3 is provided through respective resistors R5 and R6 connected in common with R4 and is regulated by means for limiting the voltage thereacross which in the embodiment illustrated comprises diodes CR1 and CR2 which provide a maximum voltage drop across the optical couplers.

In operation, when a control signal, such as a constant current of 10 milliamperes, is applied the majority of current flows through OC1, R1 and R2 and, assuming a fault condition is not present, in this mode of operation the transistor Q2 is maintained on and thus is included in the current path. The light sensitive semiconductor in OC1 conducts and acts to turn on the controlled device. Under these conditions, the voltage $V_{AB}$ terminals 20 will depend primarily on the value of R1 and R2. If a fault condition is detected by the controlled device, OC3 is deenergized, the fault signal being the absence of a signal through the light emitting diode of OC3, and Q2 will stop conduction of the voltage $V_{AB}$ will depend on R1, R2 and R3. If a trip condition occurs in the controlled device, OC2 is energized, Q1 conducts and $V_{AB}$ will depend upon R1. Thus the interface voltage $V_{AB}$, accurately reflects the status of the controlled circuit.

In the interrogate or sampling mode, short pulses (typically 50 microseconds) of control current are applied to the interface circuit to allow determination of status without turning on the controlled device, because their duration is less than the time delay 11 of power controller 10. In the sampling mode, the circuit must rapidly reach steady state conditions. In the illustrated circuit, fast response is obtained by limiting the magnitude of the voltage impressed across the light sensitive semiconductors (the phototransistors 32) of OC2 and OC3. This voltage is here limited by CR1 and CR2 to approximately 1.25 volts. The portion of control current used in each optical coupler is determined by the values of R4, R5, and R6 with R5 and R6 accomplishing current sharing between OC2 and OC3.

The following table of components is presented by way of further example to indicate a circuit as in FIG. 3 which permits obtaining response times of 3 to 15 microseconds compared to as much as 400 microseconds with conventional circuit arrangements such as those described in connection with FIGS. 2A, B and C.

Opto Couplers OC1, OC2, OC3—4N22 each
Transistors Q1 and Q2—2N2222 each
Diodes CR1 and CR2—1N914 each
Resistor R1—340 ohms
Resistor R2—460 ohms
Resistor R3—931 ohms
Resistor R4—2000 ohms
Resistors R5 and R6—1000 ohms each The invention, therefore, permits achieving a multiplicity of functions in a control interface circuit employing commercially available optical coupler devices while avoiding the delay induced by the parasitic capacitance of such devices. The limited examples presented include those within presently preferred practice. However, it will be understood that numerous additional forms of the invention may be constructed in accordance with the teachings herein.

I claim:

1. A control interface circuit, for providing electrical isolation between a control signal source and a controlled device and for selectively applying to the controlled device a signal for initiating a function therein wherein the control signal source may provide either a steady current or brief pulses of control current, comprising:
control input terminals for connection with the control signal source;
an optical coupler device comprising a light emitting element, connected with said control input terminals, and a light sensitive element in the controlled device;
a series string of a plurality of impedance elements connected with said light emitting element between said control input terminals;
switch means connected across a number of said plurality of impedance elements for selectively, upon conduction of said switch means, reducing the magnitude of impedance in series with said light emitting element;
means for controlling conduction of said switch means comprising a second optical coupler device comprising a light emitting element connected with secondary control input terminals and a light sensitive element connected with said switch means, said light sensitive element having a characteristic parasitic capacitance requiring a full charge before a stabilized output is produced therefrom;
means for supplying operating voltage across said light responsive element comprising impedance means connected between said control input terminals and means for limiting the operating voltage to a magnitude for fully charging the parasitic capacitance of said light sensitive element in a time short compared to the duration of a pulse of control signal from said control signal source.

2. A control interface circuit, in accordance with claim 1, wherein:
said plurality of impedance elements comprises at least three resistors;
said switch means comprises a first transistor connected across at least two of said resistors;
additional switch means comprising a second transistor is connected across a number of said resistors less than those which said first transistor is connected across, said second transistor also being associated with means for controlling conduction thereof comprising a third optical coupler device comprising a light emitting element connected with additional control input terminals and a light sensitive element connected with said switch means, said light sensitive element having a characteristic parasitic capacitance requiring a full charge before a stabilized output is produced; and
said means for supplying operating voltage and said means for limiting the operating voltage are associated in common with said second and third optical coupler devices.

3. A control interface circuit, in accordance with claim 1, wherein:
said means for limiting the operating voltage comprises a number of diodes serially connected within a circuit branch between said control input terminals.

4. In a power control system, a combination comprising:
a solid state power controller for controlling conduction in a load circuit, said power controller including a control signal input and turn-on time delay circuit for initiating turn-on of said power controller only upon application of a predetermined control signal to said input for at least a predetermined duration, said power controller also including first and second status indicating signal outputs for indicating whether said controller has a fault on its load circuit and whether said controller has tripped;
a controlling and status indicating device for producing control signals for said power controller and for receiving signals indicating status of said power controller, said controlling device being operable to produce a steady current signal for a time that is long compared to the turn-on time delay of said time delay circuit of said power controller to turn-on said power controller, said controlling device also being operable to produce sampling pulses of control current of short duration compared to the turn-on time delay of said time delay circuit under conditions when said power controller is to be maintained off;
a control interface circuit connected between said power controller and said controlling device, said interface circuit comprising control input terminals connected with said controlling device, a first optical coupler device comprising a light emitting element connected between said control input terminals in series with a plurality of impedance elements, said first optical coupler device also comprising a light sensitive element which is said control signal input of said power controller;
said interface circuit also comprising first and second transistor switches each respectively connected across a selected one or more impedance elements of said plurality of impedance elements so that the impedance which said first transistor switch is connected across is of greater magnitude than that which said second transistor switch is connected across;

each of said first and second transistor switches of said interface circuit having an operating circuit connected therewith respectively comprising second and third optical coupler devices each comprising a light emitting element, respectively connected with different ones of said status indicating signal outputs of said power controller, and a light sensitive element, respectively connected with said transistor switch, said light sensitive elements of each of said second and third optical coupler devices having a characteristic parasitic capacitance requiring a full charge before a stabilized output is produced therefrom;

said interface circuit further comprising means for supplying operating voltage across said light sensitive elements of said second and third optical coupler devices, said means including means for limiting the operating voltage to a magnitude for fully charging the parasitic capacitance of said light sensitive element in a time short compared the duration of a sampling pulse of control current.

5. In a power control system, a combination in accordance with claim 4 wherein:

said second optical coupler device has its light emitting element connected with a trip signal output of said power controller whereby upon occurrence of a tripped condition of said power controller the conductive state of said first transistor which changes altering the impedance of the conductive path between said control input terminals and producing at said terminals a first voltage indicating a trip to said controlling and status indicating device; and said third optical coupler device has its light emitting element connected with a fault signal output of said power controller whereby upon occurrence of a fault condition of the load circuit the conductive state of said second transistor switch changes altering the impedance of the conductive path between said control input terminals and producing at said terminals a second voltage, different than said first voltage, indicating a fault to said controlling and status indicating device, said first and second voltages both being different than that appearing at said terminals when said power controller is turned on and no fault exists in the load circuit.

* * * * *